United States Patent
Stahl et al.

(10) Patent No.: US 9,429,611 B2
(45) Date of Patent: Aug. 30, 2016

(54) NOISE SENSOR

(75) Inventors: Juergen Stahl, Herrieden (DE);
Alexander Pawellek, Stadtlauringen (DE); Markus Schmid, Jettingen-Scheppach (DE); Thomas Duerbaum, Baiersdorf (DE); Johann Kuebrich, Schlüsselfeld (DE); Hans Halberstadt, Nijmegen (NL); Frans Pansier, Nuenen (NL); Jens Goettle, Erlangen (DE); Anton Blom, Eindhoven (NL)

(73) Assignee: NXP B.V., Eindhoven (NL)

( * ) Notice: Subject to any disclaimer, the term of this patent is extended or adjusted under 35 U.S.C. 154(b) by 79 days.

(21) Appl. No.: 14/127,651

(22) PCT Filed: Jan. 13, 2012

(86) PCT No.: PCT/EP2012/051514
§ 371 (c)(1),
(2), (4) Date: Mar. 13, 2014

(87) PCT Pub. No.: WO2012/175226
PCT Pub. Date: Dec. 27, 2012

(65) Prior Publication Data
US 2014/0218048 A1 Aug. 7, 2014

(30) Foreign Application Priority Data
Jun. 22, 2011 (EP) .................................. 11250604

(51) Int. Cl.
*H04B 3/26* (2006.01)
*H03H 7/00* (2006.01)
(Continued)

(52) U.S. Cl.
CPC ............. *G01R 29/26* (2013.01); *G01R 31/001* (2013.01); *G01R 31/40* (2013.01)

(58) Field of Classification Search
CPC ..... G01R 29/26; G01R 31/001; G01R 31/40
USPC .................................... 324/613; 333/12, 181
See application file for complete search history.

(56) References Cited

U.S. PATENT DOCUMENTS

| | | | |
|---|---|---|---|
| 6,055,340 A | 4/2000 | Nagao | |
| 2011/0050358 A1 | 3/2011 | Wang et al. | |
| 2011/0241799 A1* | 10/2011 | Wang ..................... | H03H 7/427 333/181 |

FOREIGN PATENT DOCUMENTS

| | | |
|---|---|---|
| CN | 1731204 A | 2/2006 |
| CN | 101383554 A | 3/2009 |

(Continued)

OTHER PUBLICATIONS

Wenjie, Chen et al. (IEEE Transactions on Industrial Electronics, vol. 58 No. 5 May 2011).*

(Continued)

*Primary Examiner* — Farhana Hoque (57) ABSTRACT

The present invention relates to a noise sensor for an alternating or direct current power supply. The sensor comprises a noise sensing unit and a noise separator. The noise separator is configured to receive first, second and third input signals and provide a first output signal representative of the common mode noise and a second output signal representative of the differential mode noise. The noise sensing unit comprises a first capacitive element, a second capacitive element, a first resistive element and a second resistive element.

23 Claims, 6 Drawing Sheets

(51) Int. Cl.
*G01R 29/26* (2006.01)
*G01R 31/00* (2006.01)
*G01R 31/40* (2014.01)

(56) References Cited

FOREIGN PATENT DOCUMENTS

| CN | 201796530 U | 4/2011 |
|---|---|---|
| TW | 1224420 B | 11/2004 |

OTHER PUBLICATIONS

Chen, W. et al., "A Novel Hybrid Common-Mode EMI Filter With Active Impedance Multiplication", IEEE Trans. on Industrial Electronics, vol. 58, No. 5, pp. 1826-1834 (May 2011).

Hsieh, H., Effects of Mix-Mode Noise Emissions on the Design Method of Power Factor Correction Boost Rectifier EMI Filters, Intl. Power Electronics Conf. (IPEC), pp. 2438-2443 (2010).

Stahl, J. et al., "Characterisation of an Effective EMI Noise Separation Including a Standard LISN", URSI Intl. Symp. on Electromagnetic Theory (EMTS), pp. 13-19 (Aug. 2010).

International Search Report and Written Opinion for Int'l. Patent Application No. PCT/EP2012/051514 (Apr. 23, 2012).

Ting Guo et al., "Diagnosis of power supply conducted EI using a noise separator", Applied Power Electronics Conference and Exposition, 1995.

Chen, Wenjie et al; "An Experimental Study of common- and Differential-Mode Active EMI Filter Compensation Characteristics"; IEEE Transactions on Electromagnetic Compatibility, vol. 51, No. 3; pp. 683-691 (Aug. 2009).

\* cited by examiner

NOISE SENSOR

The present disclosure relates to the field of noise sensors, and in particular, although not exclusively, to noise sensors that provide a first output signal representative of common mode noise and a second output signal representative of differential mode noise.

Electromagnetic compatibility can be an important issue with electronic devices. For example, in order to comply with international standards. In addition, the increasing electromagnetic noise susceptibility in digital circuits can contribute to the importance of electromagnetic compatibility.

Noise on a power line may be expressed as potential difference with respect to the protective earth. In a power supply, with two power lines and an earth connection, this transient noise can include common mode (CM) noise and differential mode (DM) noise. CM noise is a potential that is present on both lines compared to earth. DM noise can be expressed as a potential of opposing magnitude present on each of the power lines compared with the earth. In typical applications, both CM and DM noise are present.

Electromagnetic compatibility can be an important issue for electronic devices. For example, in order to comply with international standards. In addition, the increasing electromagnetic noise susceptibility in digital circuits can increase the importance of maintaining electromagnetic compatibility. Active EMI filters may offer a solution to maintaining electromagnetic compatibility.

The listing or discussion of a prior-published document or any background in the specification should not necessarily be taken as an acknowledgement that the document or background is part of the state of the art or is common general knowledge.

According to an aspect of the invention there may be provided a noise sensor having a first power terminal and a second power terminal and a third power terminal for receiving signals from a power supply, the noise sensor comprising:
  a noise separator having a first input, a second input, a third input, a first output for providing a first output signal representative of common mode noise and a second output for providing a second output signal representative of differential mode noise; and
  a noise sensing unit, wherein the noise sensing unit comprises:
    a first capacitive element that couples the first input of the noise separator to the first power terminal; and
  the noise sensing unit further comprises either:
    a second capacitive element that couples the second input of the noise separator to the second power terminal;
    a first resistive element that couples the first input of the noise separator to the third power terminal; and
    a second resistive element that couples the second input of the noise sensor to the third power terminal,
  or the noise sensing unit comprises:
    a second capacitive element that couples the second input of the noise separator to the third power terminal;
    a coupling between the second power terminal and the third input of the noise separator;
    a first resistive element that couples the first input of the noise separator to the second power terminal; and
    a second resistive element that couples the second input of the noise separator to the third power terminal via the second capacitive element.

The present invention provides a combined CM and DM noise separator which determines the CM and DM noise using signals provided by the first and second capacitive elements. Capacitive elements can be cheaper, smaller and do not impose the same bandwidth constraints as inductive sensors.

In other examples, resistors may be used instead of capacitors. However, this introduces power losses and therefore is not preferable. As such, the use of capacitive elements as sensing elements is advantageous over the use of inductive components seen in the prior art.

The provision of the first and second resistive elements allows a voltage to be measured by the noise sensing unit. One advantage afforded by the provision of the first and second resistive elements is that the measurement of a potential difference across the resistive elements reduces the effect of the tolerance of the capacitive elements on the measured signals.

A further advantage is that the noise separator can provide all of the information that is required to compensate for both CM and DM noise within a circuit.

The first input of the noise separator may be configured to receive current or voltage input signals. The second input of the noise separator may be configured to receive current or voltage input signals. The first output of the noise separator may be configured to provide current output signals. The second output of the noise separator may be configured to provide current output signals.

The first output of the noise separator may be configured to provide voltage output signals. The second output of the noise separator may be configured to provide voltage output signals.

The output of the sensor may be provided to a device configured to at least partially compensate for common mode noise and/or differential mode noise in the power supply.

Active noise compensation, instead of passive noise compensation, may allow improved performance of a device in terms of space and efficiency. The separate CM and DM noise signals provided by embodiments of the present invention may be suitable for enabling compensation from the noise via feedback and/or feed forward.

The power supply may be an alternating current power supply, which may be a single phase alternating current power supply. Alternatively, the power supply may be a direct current power supply.

The cumulative reactance between the first input of the noise separator and the first power terminal may be capacitive reactance. The cumulative reactance between the second input of the noise separator and the second power terminal may be capacitive reactance. The cumulative reactance between the second input of the noise separator and the third power terminal may be capacitive reactance. In this way, inductive sensing elements can be eliminated from the sensing unit. As such the sensing unit may be characterised in that its overall reactance is capacitive. The sensor may not include a transformer or other inductor. Herein, the term inductor may comprise a coil of wire with significant inductance. A simple wire connection, which has inherent inductance, is not within the meaning of an "inductor" as described herein as its inductance does not provide a significant contribution to the filtering properties of the circuit.

Herein, the term coupled may mean a direct electrical connection between two elements. In other words, coupling may imply a galvanic contact between the two elements.

When used with an AC power supply, the first power terminal may be a phase power terminal, the second power terminal may be a neutral power terminal and the third power terminal may be an earth power terminal. The earth power terminal may also be referred to as protective earth. When used with a DC power supply, the first power terminal may be a positive power terminal, the second power terminal may be a negative power terminal and the third power terminal may be an earth power terminal. The first and second power terminals may be interchangeable without affecting operation of the noise sensor of some embodiments.

The first capacitive element may comprise a y-capacitor. The second capacitive element may comprise a y-capacitor. The provision of y-capacitors may be beneficial for embodiments of the invention that are to be used in high voltage environments as they comply with safety standards that apply to such systems.

The noise sensor (which may be referred to as an electromagnetic interference sensor) can be implemented as part of an active EMI filter in order to meet the requirements of EMI regulations of electronic equipment.

The third power terminal of the noise sensor may be an earth terminal for receiving signals from the power supply. The first resistive element may couple the first input of the noise separator to the earth terminal or neutral or negative power. The second resistive element may couple the second input of the noise separator to the earth terminal. A coupling may be provided between the second or third power terminal and the third input of the noise separator.

The resistance of the first resistive element may be substantially equal to the resistance of the second resistive element. The capacitance of the first capacitive element may be substantially equal to the capacitance of the second capacitive element. The equivalence of the values of the components coupled to the first and second input of the noise separator may enable simplification of the internal design of the noise separator. Herein, "substantially equal to" may mean within 0.1%, 0.5%, 1%, 5%, 10% or 25%.

The noise separator may comprise an adder. Inputs of the adder may be coupled to the first input and the second input of the noise separator. An output of the adder may be coupled to the first output of the noise separator. The noise separator may comprise a subtractor. Inputs of the subtractor may be coupled to the first input and the second input of the noise separator. An output of the subtractor may be coupled to the second output of the noise separator.

Alternative arrangements of sub-units within the adder or subtractor may derive similar signals that are indicative of CM and DM noise.

The adder may be an adder amplifier. The subtractor may be a differential amplifier. The power supplies of the amplifiers may be fed with respect to the third power terminal. It will be apparent to those skilled in the art that alternative components may be suitable for implementing the adder and subtractor.

The noise separator may further comprise an output amplifier between the output of the adder and the first output of the noise separator. The noise separator may further comprise an output amplifier between the output of the subtractor and the second output of the noise separator.

Additional amplification may be advantageous in some embodiments, particularly where the output of the CM-DM noise separator is to provide a signal for cancelling, or partially cancelling components of the noise in a circuit.

The noise separator may further comprise a first input amplifier. An input of the first input amplifier may be coupled to the first input of the noise separator. An output of the first input amplifier may be coupled to a first input of the adder. An output of the first input amplifier may be coupled to a first input of the subtractor.

The noise separator may further comprise a second input amplifier. An input of the second input amplifier may be coupled to the second input of the noise separator. An output of the second input amplifier may be coupled to a second input of the adder. An output of the second input amplifier may be coupled to a second input of the subtractor.

The provision of input amplifiers may be advantageous as it can provide decoupling between the sensing unit and the separator. The first input of the noise separator may be configured to receive voltage input signals. The second input of the noise separator may be configured to receive voltage input signals.

The second capacitive element may be coupled in series with the second resistive element to connect the third power terminal with the second input terminal of the noise separator.

The noise sensor may comprise only one y-capacitor because of the configuration of the noise sensing unit of the noise sensor. The second capacitive element may be a y-capacitor. An advantage of this embodiment is that the cost of manufacturing the unit can be reduced compared to designs where more than one capacitor needs to be connected between a live power line and the protective earth. All capacitors coupled in such a way should be y-capacitors for safety reasons. The first capacitive element of some embodiments does not need to be a y-capacitor as it couples two live power lines, rather than a live power line and the potential earth.

The noise separator may provide a signal at its first output from a signal received at its first input. The signal at the first output may be a signal indicative of DM noise. The signal received at the first input of the noise separator may be taken with reference to the second power terminal of the power supply. That means that the second power terminal can be considered to be an output reference line. The term "referenced to" may take the same meaning as "measured with respect to" herein.

The noise separator may provide a signal at its second output by adding a signal derived from its first input to a signal derived from its third input. The signal at the second output may be a signal indicative of CM noise. The signal received at the third input of the noise separator may be taken with reference to the second input. The output reference may be the second power terminal.

Functions of the noise separator may be implemented, or performed, by amplifiers. Each of the amplifiers may provide gain or, alternatively, the gain of one or more of the amplifiers may be unity. In addition, the amplifiers may also filter and/or shape and/or phase correct signals. An amplifier may act as a buffer. The power supply of the amplifiers may be fed with respect to the second power terminal. The CM-DM noise separator may be supplied with power with respect to the DC bus. This feature also distinguishes such embodiments over the prior art.

The input impedances of the noise separator or any of its components may be a low impedance or effectively zero. Alternatively, the input impedances of the noise separator or any of its components may be effectively infinitely high.

The noise sensing unit may comprise only capacitors or only capacitors and resistors. The noise separator may be realized as an integrated circuit or with discrete components. The noise sensing unit may be provided in the same integrated circuit as the noise separator.

The noise sensor may provide only either CM or DM output signals.

There may be provided a noise sensor having a first power terminal and a second power terminal and a third power terminal for receiving signals from a power supply, the noise sensor comprising:
a noise separator having a first input, a second input, a third input, a first output for providing a first output signal representative of common mode noise and a second output for providing a second output signal representative of differential mode noise; and
a noise sensing unit, wherein the noise sensing unit comprises:
a first capacitive element that couples the first input of the noise separator to the first power terminal;
a second capacitive element that couples the second input of the noise separator to the second power terminal;
a first resistive element that couples the first input of the noise separator to the third power terminal; and
a second resistive element that couples the second input of the noise separator to the third power terminal.

There may be provided a noise sensor having a first power terminal and a second power terminal and a third power terminal for receiving signals from a power supply, the noise sensor comprising:
a noise separator having a first input, a second input, a third input, a first output for providing a first output signal representative of common mode noise and a second output for providing a second output signal representative of differential mode noise; and
a noise sensing unit, wherein the noise sensing unit comprises:
a first capacitive element that couples the first input of the noise separator to the first power terminal;
a second capacitive element that couples the second input of the noise separator to the third power terminal;
a coupling between the second power terminal and the third input of the noise separator;
a first resistive element that couples the first input of the noise separator to the second power terminal; and
a second resistive element that couples the second input of the noise separator to the third power terminal via the second capacitive element.

There may be provided a noise sensor having a first power terminal and a second power terminal for receiving signals from a power supply, the noise sensor comprising:
a noise separator having a first input, a second input, a first output for providing a first output signal representative of common mode noise and a second output for providing a second output signal representative of differential mode noise; and
a noise sensing unit, wherein the noise sensing unit comprises:
a first capacitive element that couples the first input of the noise separator to the first power terminal; and
a second capacitive element that couples the second input of the noise separator to the second power terminal.

There may also optionally be provided one or more of:
a first resistive element that couples the first input of the noise separator to the third power terminal;
a second resistive element that couples the second input of the noise sensor to the third power terminal;
a coupling between the second power terminal and the third input of the noise separator;
a first resistive element that couples the first input of the noise separator to the second power terminal; and
a second resistive element that couples the second input of the noise separator to the third power terminal via the second capacitive element.

There may be provided a computer program, which when run on a computer, causes the computer to configure any apparatus, including a circuit, controller, sensor, filter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software implementation may be an assembly program.

The computer program may be provided on a computer readable medium, which may be a physical computer readable medium, such as a disc or a memory device, or may be embodied as a transient signal. Such a transient signal may be a network download, including an internet download.

A description is now given, by way of example only, with reference to the accompanying drawings, in which.

One or more embodiments of the invention relate to a common mode (CM) and differential mode (DM) noise sensor comprising a noise sensing unit and a CM-DM noise separator. The noise sensing unit may comprise two capacitors, which may be substantially equal. The first capacitor can be coupled between a first terminal of a power supply and a first input of the CM-DM noise separator. The second capacitor can be coupled between a second terminal of the power supply and a second input of the CM-DM separator.

The CM-DM noise separator can process the signals received at its two inputs and provide a first output signal representative of common mode noise and a second output signal representative of differential mode noise.

CM noise and DM noise can be sensed by a single sensing unit. The sensing of both noise components is performed together and no separation may take place by the elements of the sensing unit. The CM and DM noise signals can be subsequently separated by a noise separator, which can advantageously be provided by a single integrated circuit (IC). Separation is possible due to the relationship between CM and DM noise.

The nature of CM and DM noise makes it possible to separate the CM and DM noise by performing addition and subtraction operations. The addition of the signals from each capacitor results in a signal that is proportional to the CM noise level. The subtraction of the signal from a capacitor from a signal provided by the other capacitor results in a signal that is proportional to the DM noise level.

In some examples, the noise sensing unit also includes two resistors: a first resistor coupled between protective earth and the node between the first capacitor and first input of the CM-DM noise separator; and a second resistor coupled between protective earth and the node between the second capacitor and second input of the CM-DM noise separator.

It is known that passive filters can be used to reduce electromagnetic interference (EMI) noise. Passive filters can be cheap and robust, but may occupy a lot of physical space on a printed circuit board (PCB) when compared to the space that is occupied by the components that perform the desired functionality of a device. In addition, the energy consumption of passive filters cannot be neglected and such filters can therefore reduce the efficiency of the whole system.

Active filters may be considered as providing advantages over passive filters in terms of PCB space occupation and power efficiency. In order to actively reduce EMI noise, the noise signal to be compensated for must be detected. However, the sensing of a pure noise signal itself can be considered insufficient for an active filter as two types of conducted noise, common mode (CM) and differential mode (DM) noise, require different cancellation or mitigation methods. Therefore, it can be important to sense, or determine, the distribution of the noise between CM and DM such that the noise can be properly accounted for.

In prior art solutions, inductors or transformers are used as sensing elements in CM and DM sensing applications. The separation of CM and DM noise can be performed by a special arrangement of the different windings of the inductor or transformer. However, there are disadvantages of using inductive components in this way. One problem with inductors, or chokes, is the obtainable bandwidth. EMI regulations regarding conducted noise are specified up to high frequencies (typically 30 MHz). This, in turn, means that the noise separator has to work at these frequencies. Another problem with inductor based solutions is the difficulty of obtaining a detailed and accurate model of the behaviour of these components. A model of the separator is needed in order to design a controller for the active EMI filter. In addition, the production of such transformers with all the mentioned requirements is also technically complicated.

Embodiments of the present invention can address problems posed by prior art noise sensing using inductive components experienced by prior art solutions. Embodiments of the invention can be very important for the field of active EMI filters as they can be made a more attractive proposition for noise cancellation within circuits.

Another advantage of embodiments of the invention is that CM as well as DM noise can be processed together by the same sensing unit. The signals are subsequently separated. Therefore, only one sensing stage is needed and not two (one for CM noise and one for DM noise) as in prior art solutions.

Figure 1:
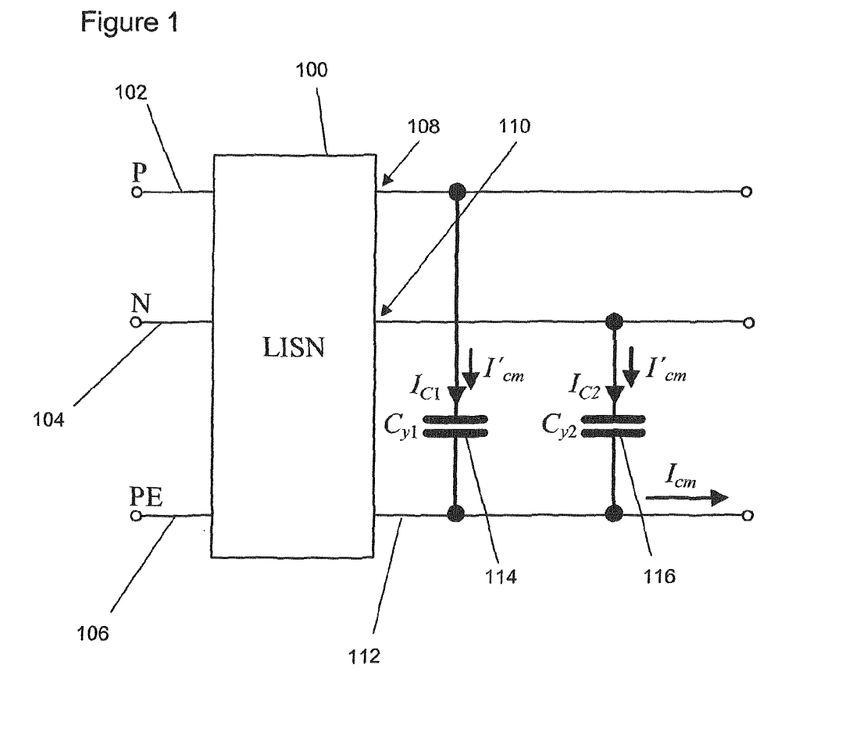
FIG. 1 illustrates common mode noise current distribution through capacitors coupling first and earth, and second and earth power lines.

FIG. 1 shows a circuit that will be used to discuss common mode (CM) noise distribution. The circuit of FIG. 1 includes a line impedance stabilisation network (LISN) 100, which is a known measurement tool that is used for detecting electromagnetic interference (EMI). The LISN is only required when performing compliance measurements for a device under test (not shown), and is not present during normal operation of a device connected to the power source. The LISN ensures that no high frequency noise is provided to the mains by the device undergoing testing and that the device under test sees a normal mains voltage and well defined line impedance.

The LISN 100 in this example, and those that follow, is illustrated coupled to an alternating current power supply. The LISN 100 has a phase input 102 for connecting to the phase output of a power supply, a neutral input 104 for connecting to the neutral output of a power supply, and a protective earth input 106. Similarly, the LISN 100 has a phase output 108, a neutral output 110, and a protective earth output 112 all of which provide signals that are suitable for subsequently testing the power lines for EMI.

A device (not shown) undergoing testing may be connected to the phase output 108, neutral output 110 and protective earth output 112 of the LISN 100. During normal operation of the device the LISN 100 is not present in the circuit and the device would be directly connected to the mains supply.

The LISN 100 comprises various inductive and capacitive elements that effectively isolate any noise present on the inputs 102, 104, 106 of the LISN 100 from the signals provided to the outputs 108, 110, 112 of the LISN 100 and any noise that may be present at the outputs 108, 110, 112 of the LISN 100 is isolated from the power supply at inputs 102, 104, 106 of the LISN 100. The LISN 100 possesses a standardized and well defined impedance for a certain frequency range (typically between 150 kHz and 30 MHz) in order to allow reproducible measurement of the characteristics of a device under test independent of the mains supply conditions. Alternatively, the LISN may be excluded from the circuit, in which case capacitors 114, 116 would be connected directly to the power supply, which may be the mains.

A first capacitor 114 is connected between the phase output 108 and the protective earth output 112 of the LISN 100. A second capacitor 116 is connected between the neutral output 110 and the protective earth output 112 of the LISN 100. The second capacitor 116 has the same value as the first capacitor 114. The capacitors 114, 116 provide a high impedance for low frequency signals, significantly blocking the large phase signal present in the mains power supply (typically 50 or 60 Hz), but allowing higher frequency signal, such as CM noise, to be conducted across their plates. A current representative of the common mode noise ($I'_{CM}$) flows through both the first and second capacitors 114, 116 towards protective earth 112. That is, the common mode current in the first and second capacitors 114, 116 are in-phase. Therefore, the current flowing at the protective earth output 112 can be considered as representative of the common mode noise ($I_{CM}$).

Figure 2:
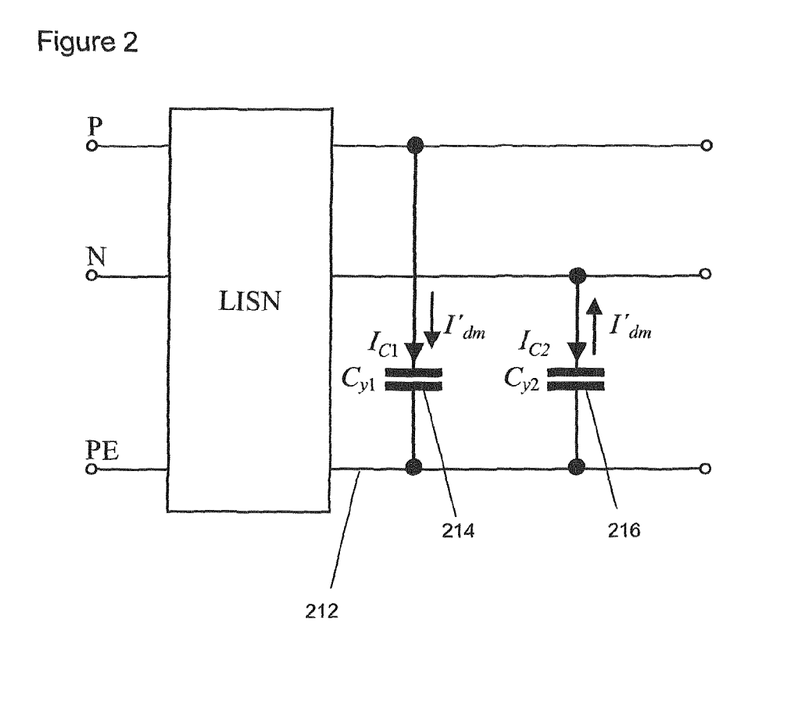
FIG. 2 illustrates differential mode noise current distribution through capacitors coupling first and earth, and second and earth power lines.

FIG. 2 shows the same circuit as FIG. 1, and will be used to discuss differential mode (DM) noise distribution.

In FIG. 2, a current $I_{c1}$ representative of differential mode noise ($I'_{DM}$) flows from the phase output of the LISN through the first capacitor 214 towards protective earth 212.

At the same time a current $I_{c2}$ flows from the neutral output of the LISN through the second capacitor 216 towards protective earth 212. Current $I_{c2}$ is representative of the differential mode noise ($I'_{DM}$) that flows through the second capacitor 216 away from protective earth 212 to the neutral output terminal of the LISN. The two currents $I_{c1}$ and $I_{c2}$ through the first and second capacitors 214, 216 are out-of-phase by 180 degrees in the case that only DM noise is present.

Figure 3:
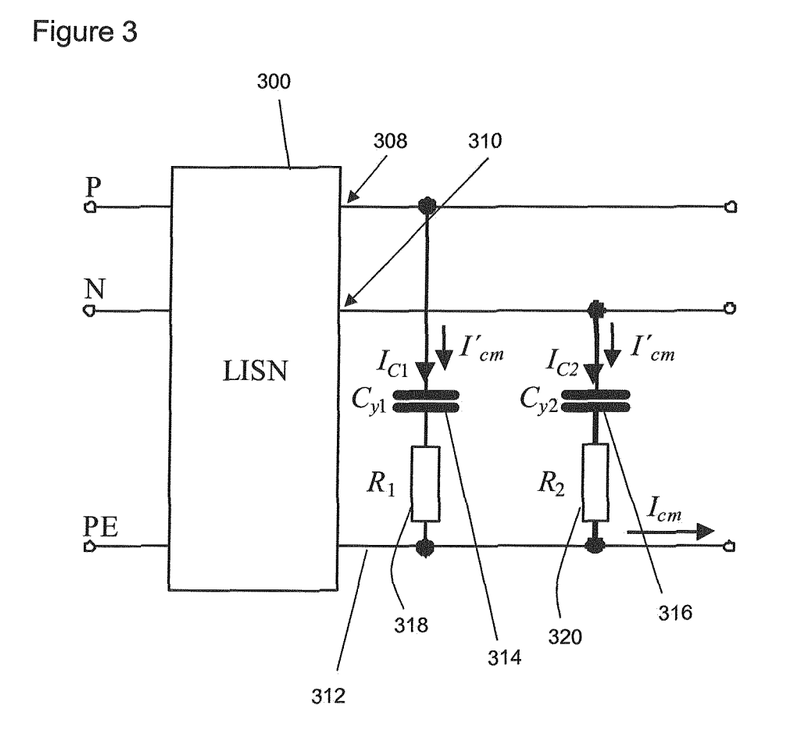
FIG. 3 illustrates common mode noise current distribution through RC series circuits coupling first and earth, and second and earth power lines.

FIG. 3 shows a circuit that is similar to that of FIG. 1 and will also be used to discuss common mode (CM) noise distribution. In addition to all of the components of FIG. 1, FIG. 3 includes a first resistor 318 and a second resistor 320. The first resistor 318 is connected in series with the first capacitor 314 between the phase output 308 of the LISN 300 and the protective earth output 312 of the LISN 300. Similarly, the second resistor 320 is connected in series with the second capacitor 316 between the neutral output 310 of the LISN 300 and the protective earth output 312 of the LISN 300. The addition of the two resistors 318, 320 enables a voltage to be measured. The voltage is due to the noise signal between the respective outputs of the LISN 300 or the mains power supply.

In the same way as for FIG. 1, the common mode current in the first and second capacitors 314, 316 of FIG. 3 and the resulting voltages $V_{R1}$, $V_{R2}$ across the resistors $R_1$ 318 and $R_2$ 320 of FIG. 3 are in-phase.

Figure 4:
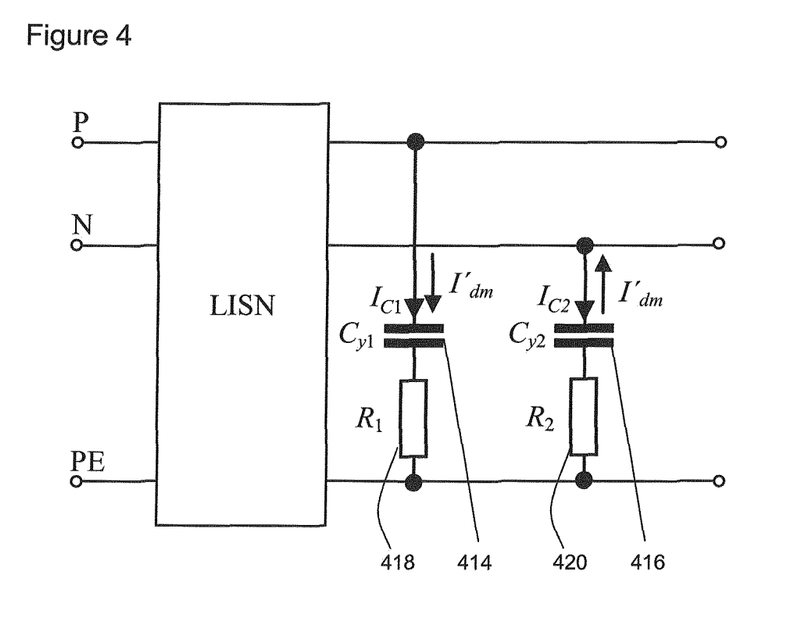
FIG. 4 illustrates differential mode noise current distribution through RC series circuits coupling first and earth, and second and earth power lines.

FIG. 4 shows the same circuit as FIG. 3, and is used to discuss differential mode (DM) noise distribution. In the same way as discussed with reference to FIG. 2, the currents $I_{c1}$, $I_{c2}$ through the first and second capacitors 414, 416 and the resulting voltages across the resistors $R_1$ 418 and $R_2$ 420 are out-of-phase by 180 degrees.

Embodiments of the present invention relate to a new CM-DM sensor for performing combined CM and DM detection. In various embodiments the detected CM and DM signals may be fed to an active EMI filter. In various embodiments, one output may deliver an amplified signal that is proportional to sensed CM noise, and the other output may provide a signal proportional to amplified DM noise. Both CM and DM noises are measured together by a sensing unit and subsequently separated by a CM-DM noise separator. Standard components such as capacitors and resistors can be used to provide a noise sensing and measuring unit. The noise sensing unit can provide input to a separation unit/component where the CM and DM noise signals can be separated.

Prior art solutions may require separate sensing elements for each of their respective CM and DM sensors. The present invention therefore offers a reduced cost of manufacture compared to such systems.

Figure 5:
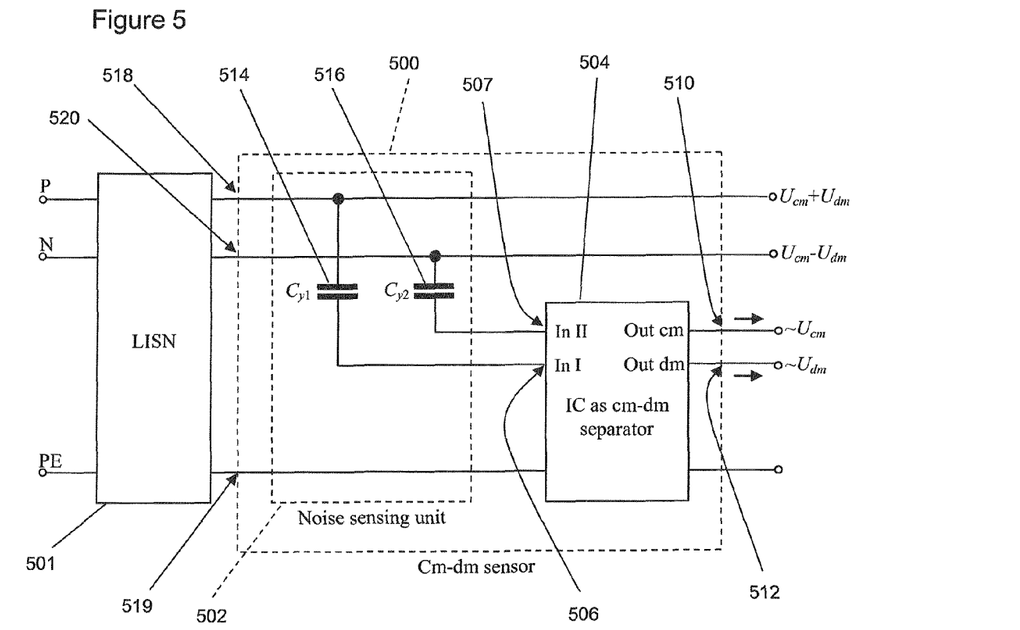
FIG. 5 illustrates a common and differential mode noise sensor.

FIG. 5 illustrates a noise sensor 500. The noise sensor 500 has a first power terminal 518 (which in the AC case may be referred to as a phase power terminal), a second power terminal 520 (which in the AC case may be referred to as a neutral power terminal) and a protected earth terminal 519 that receive signals from a single phase power supply via a LISN 501 or directly from the mains power supply. The noise sensor 500 has a first output 510 for providing a first output signal representative of common mode (CM) noise and a second output 512 for providing a second output signal representative of differential mode (DM) noise. The output signals can be proportional to the CM and DM noise.

The noise sensor comprises a noise sensing unit 502 and a noise separator 504. The noise sensing unit 502 has a first input that receives an input signal from the first power terminal 518 of the noise sensor 500 and is coupled to a first plate of a first capacitor 514. The second plate of the first capacitor 514 is coupled to a first input 506 of the noise separator 504. The noise sensing unit 502 has a second input that receives an input signal from the second power terminal 520 of the noise sensor 500 and is coupled to a first plate of a second capacitor 516. The second plate of the second capacitor 516 is coupled to a second input 507 of the noise separator 504. In this example the capacitors are class 'y' capacitors, which may be required in high power applications due to safety considerations. The capacitance of the capacitors 514, 516 may be small enough to block low frequency (e.g. dc, 50 Hz, 100 Hz), high voltage signals from entering the CM-DM noise separator and may be high enough to let pass high frequency components above 9 kHz or 150 kHz. Therefore relatively inexpensive components can be used. The capacitance of capacitors 514, 516 may range from portions of a picofarad to several nanofarads, for example.

The first and second capacitors 514, 516 can have substantially equal capacitance. This can be advantageous as it allows noise separator 504 to be designed with the assumption that the noise sensing elements 514, 516 offer equivalent noise conducting properties. This assumption simplifies the design of the noise separator 504.

However, the tolerances of class 'y' capacitors tend to be relatively large; a 10% tolerance is quite usual for a class 'y' capacitor. More expensive, higher precision capacitors can be used for embodiments where even small asymmetries will result in a huge degradation of the performance of the noise sensor 500.

The capacitors 514, 516 enable noise currents to flow between the respective output terminals 518, 520, 519 of the LISN 501 and the noise separator 504 in order to allow processing by the noise separator 504. These noise currents, related to the CM and DM noise, are as described above with reference to FIGS. 1 and 2.

The noise separator 504 may be provided as an integrated circuit (IC) and is configured to process signals that include information in relation to both CM and DM noise that are received at its inputs 506, 507 and provide separate output signals for CM and DM noise to first and second outputs 510, 512, respectively. The noise separator 504 in this example is also coupled to the protected earth terminal 519. Further details of an implementation of the noise separator 504 are provided below in relation to FIG. 7.

It will be appreciated that any components that are described herein as being coupled or connected could be directly or indirectly coupled or connected. That is, one or more components could be located between two components that are said to be coupled or connected whilst still enabling the required functionality to be achieved.

Figure 6:
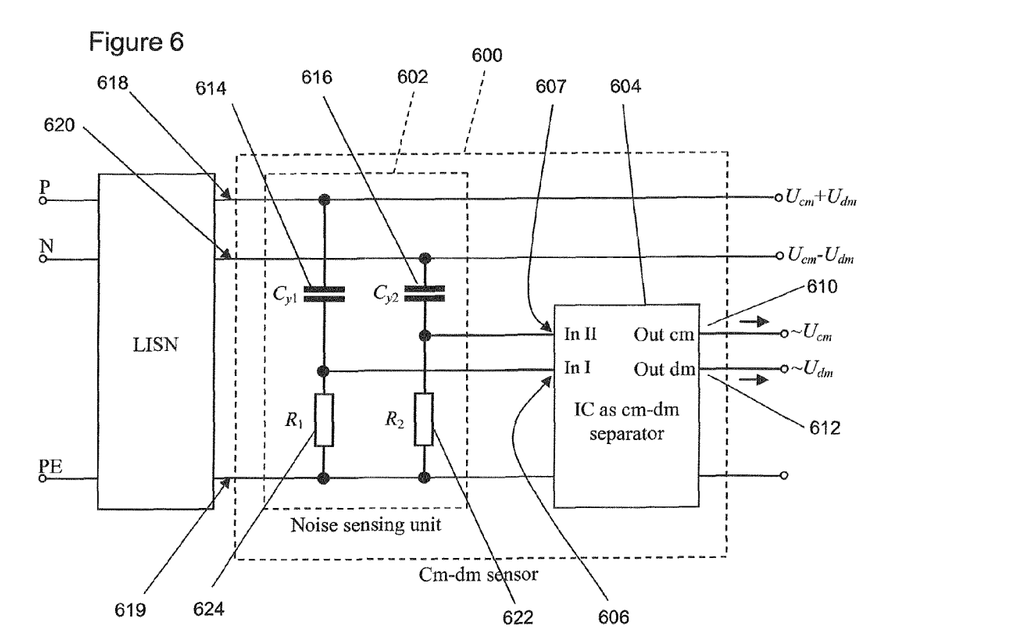
FIG. 6 illustrates a common and differential mode noise sensor in accordance with an embodiment of the present invention for use with an alternating current power supply.

FIG. 6 illustrates a noise sensor 600 according to an embodiment of the invention. The circuit of FIG. 6 includes a noise sensing unit 602 having a first capacitor 614 and a second capacitor 616 that are similar to corresponding components of FIG. 5. Also, the noise sensor 600 includes a noise separator 604 having a first input 606 and a second input 607 that are similar to the corresponding components of FIG. 5. The configuration of a first power terminal 618 (phase power terminal 618), second power terminal 620 (neutral power terminal 620) and a third power terminal 619 (protective earth terminal 619) in FIG. 6 is similar to that shown in FIG. 5.

The noise sensing unit 602 of FIG. 6 also includes a first resistor 624 and a second resistor 622. The first resistor 624 is connected between the second plate of the first capacitor 614 and protected earth terminal 619. The second resistor 622 is connected between the second plate of the second capacitor 616 and protected earth terminal 619.

The first and second resistors 624, 622 of FIG. 6 can be used as sensing resistors with potential differences between the first 606 and second 607 inputs of the noise separator 604 and the earth terminal 619. This allows the noise separator 604 to be implemented using voltage sensitive elements, rather than current sensitive elements. It will be appreciated that the input impedances of the noise separator 504, 604 is a low impedance—ideally zero—for a current sensing case (FIG. 5) and a very high impedance—ideally infinitely high—for a voltage sensing case (FIG. 6).

The capacitors 614, 616 suppress low frequency components in the signals from the LISN or the power supply. These capacitors can be y-capacitors for high voltage applications in order to satisfy safety requirements.

The addition of resistors 624, 622 has the advantage that the tolerances in the values of commercially available resistors tend to be smaller than those of commercially available capacitors. That is, high precision resistors tend to be cheaper than high precision capacitors. As such, two resistors 622, 624 of very similar resistance can be added at little additional cost. The values of components 614, 616, 622, 624 can be chosen such that the effect of the relative variance of the capacitors on the potential difference measured across the resistors 622, 624 is reduced or minimised in the relevant frequency range, which may be frequencies above 9 kHz, 50 kHz or 100 kHz or 150 kHz, in some examples.

The relative weighting of the components 614, 616, 622, 624 is important, as this weighting affects the measured values of current or voltage at the first 606 and second 607 inputs of the noise separator 604. In some examples, it can be advantageous for the capacitors 614, 616 to have substantially equal values and the resistors 622, 624 to have substantially equal values so that the designs of the noise separator 604 can be simplified by the assumption that both sets of capacitors and resistors have substantially equal impedance.

The configuration shown in FIG. 6 can provide improved performance compared to the circuit of FIG. 5 due to the improvements derived from the better tolerance of resistors compared to the tolerances of economically viable class 'y' capacitors. The noise separator 604 of the CM-DM sensor is sensitive to imbalances caused by the tolerances of the sensing components 614, 616, 622, 624. Therefore, it is advantageous to use series connections of a resistor 624, 622 and a capacitor 614, 616 instead of just a capacitor as the effect of any inaccuracies in the component values of the capacitors 614, 616 is reduced in the presence of the resistors 622, 624 and proper adjusted values In this embodiment, the required symmetry is related to the value of the resistors, which are commonly available with a 0.1% accuracy. This accuracy is considered capable of providing acceptable performance of the noise separator.

Figure 7:
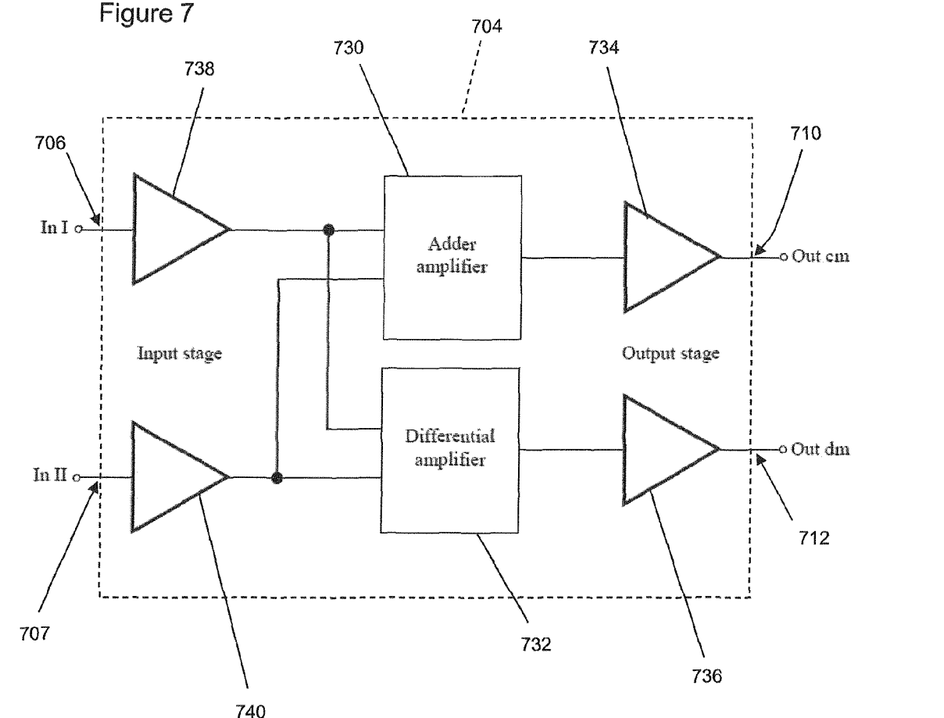
FIG. 7 illustrates a functional diagram for a common and differential mode noise separator.

FIG. 7 illustrates a noise separator 704 according to an embodiment of the invention. The noise separator 704 may be provided as a single integrated circuit (IC). This may be considered as advantageous as a single surface mounted device (SMD) can be used to provide an output signal representative of CM noise that is separate from an output signal that is representative of DM noise.

The noise separator 704 of FIG. 7 includes an adder amplifier 730, which is an example of an adder, and a differential amplifier 732, which is an example of a subtractor. The amplifiers in FIG. 7 are fed with power supplies generated with respect to the potential earth line (not shown). It will be appreciated that the adder amplifier 730 and differential amplifier 732 do not necessarily need to amplify signals in some embodiments.

The first input 706 of the noise separator 704 is coupled to an input of a first input amplifier 738. The output of the first input amplifier 738 is provided as an input to the adder amplifier 730. The second input 707 of the noise separator 704 is coupled to an input of a second input amplifier 740. The output of the second input amplifier 740 is also provided as an input to the adder amplifier 730. The adder amplifier 730 is configured to add the two input signals and provide an output signal that is representative of the CM noise. As will be appreciated from FIG. 1 and FIG. 3, the CM components of the signals that are provided at the two inputs 706, 707 are in-phase and therefore can be added together in order to provide the required CM output signal. In this embodiment, the output of the adder amplifier 730 is provided to an input of a first output amplifier 734, and the output of the first output amplifier 734 is coupled to the first output 710 of the noise separator 704.

The output of the first input amplifier 738 and the output of the second input amplifier 740 are also provided as inputs to the differential amplifier 732. The differential amplifier 732 is configured to subtract one input signal from the other and provide an output signal that is representative of the DM noise. As will be appreciated from FIG. 2 and FIG. 4, the DM components of the signals that are provided at the two inputs 706, 707 are out-of-phase and therefore can be subtracted in order to provide the required DM output signal. In this embodiment, the output of the differential amplifier 732 is provided to an input of a second output amplifier 736, and the output of the second output amplifier 736 is coupled to the second output 712 of the noise separator 704. The first 710 and second 712 outputs can also be referred to as first and second output ports.

The first 738 and second 740 input amplifiers provide decoupling, as well as possible pre-amplification, between the noise sensing unit and the adder 730 and differential 732 amplifiers. First 734 and second 736 output amplifiers may also provide decoupling, as well as possible additional amplification, between the adder 730 and differential 732 amplifiers and the first 710 and second 712 output terminals. In some examples, the input amplifiers 738, 740 and/or output amplifiers 734, 736 may be considered optional.

Any of the amplifiers 734, 736, 738, 740, as well as the adder and the subtractor may also be used for frequency response compensation or phase compensation.

The two output signals provided by the first 710 and second 712 outputs can be made available for post-processing. In embodiments where the noise separator 704 is provided on a single integrated circuit, the output signals can be provided to other components within the same integrated circuit. Alternatively, the output signals can be provided to separate discrete components in order to reduce the noise signal present on the power supply.

The CM-DM noise sensors 500, 600 in FIGS. 5 and 6 each comprise a noise sensing unit and a noise separator. In contrast to the prior art, embodiments of the invention can provide two output signals, which may be proportional to CM and DM noise, from only two sensing elements coupled to the second (neutral) and first (phase) power lines of a power supply. Also, a combined CM and DM noise sensor represents a difference from, and significant improvement over, the prior art. Additional advantages, such as improved bandwidth and reduced occupation of physical space can be achieved if the sensor is built without a magnetic component that is required in the prior art.

The amplifiers 730, 732 of FIG. 7 may be configured to add and subtract signals representing currents, for use in the circuit shown in FIG. 5, or to add and subtract signals representing voltages, for use in the circuit shown in FIG. 6. The output signals from the amplifiers 734, 736 representative of the CM or DM noise signal can be voltage signals or current signals.

Some embodiments may comprise an adder amplifier 730 and a differential amplifier 732 on a single IC. This single IC can offer all of the functions of the noise separator and provide a first output for delivering a signal that is proportional to the CM noise and another output for delivering a signal that is proportional to the DM noise on the power lines. An active filter, controller and output stage can be integrated on the same IC. Providing several complimentary functional units, such as a controller which can additionally be provided in some embodiments to manage the performance of the noise separator and amplifiers on a single IC can save PCB space.

It will be appreciated that the noise separator may be implemented as a single integrated circuit, multiple integrated circuits, discrete components, or as a combination of an integrated circuit and discrete components. One or more of the resistors and capacitors shown in FIGS. 5 and 6 may be discrete components or incorporated into an integrated circuit. The noise sensing unit may be present in the same integrated circuit as the noise separator.

The detection and separation technique illustrated in FIG. 6 may also be appropriate for noise detection in direct current circuit applications. FIG. 8 shows a functional diagram illustrating an example connection between a cm-dm noise sensor 802 in accordance with the first aspect of the invention and a direct current power supply. The CM-DM noise detection and separation technique is also possible in a DC bus or on a rectified mains supply.

Figure 8A:
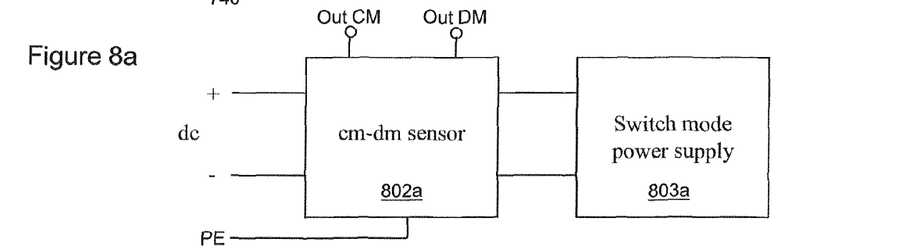
FIG. 8 illustrates a functional diagram of an embodiment of the invention for use with a direct current power supply.
Figure 8B:
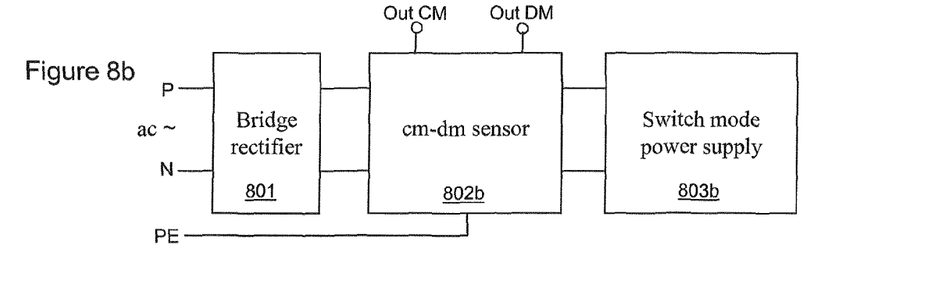

The first and second power terminals of the noise sensor could be:
  directly coupled to a DC supply, as illustrated in FIG. 8a;
  provided with the voltage across an elcap of a bridge elcap configuration, as illustrated in FIG. 8b; or
  provided with the voltage across a DC bus capacitor fed by a power factor correction stage.

In both FIGS. 8a and 8b, two outputs of the CM-DM sensor are provided to a switch mode power supply. The two outputs, one representative of CM noise and one representative of DM noise, provide the sensed and separated CM and DM signals.

The power supplies to the noise separator shown in FIGS. 5 to 8 are referenced to protective earth. One or more of the active devices within the noise separator, including the amplifiers, are supplied by protective earth referenced voltage sources. It can be difficult to generate such a voltage source out of the mains or DC bus. It may be preferable in some circumstances to use a noise separator referenced to the phase or neutral power supply mains (in an AC system) or to the positive or negative power supply (for a DC bus, or on a rectified mains supply) so as to simplify the design of the noise separator.

Figure 9:
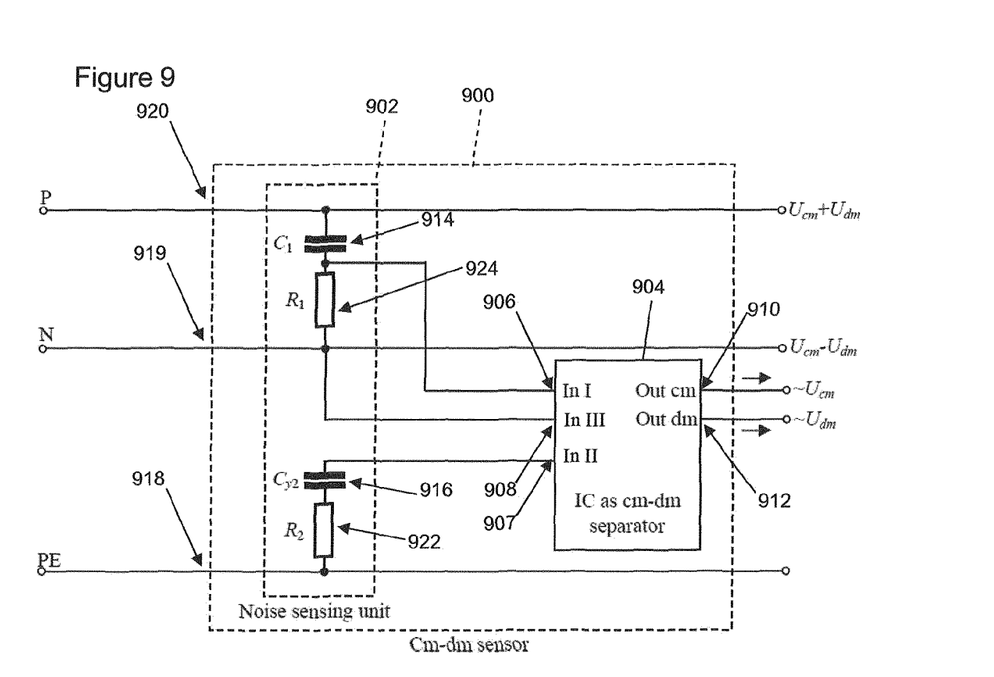
FIG. 9 illustrates a common and differential mode noise sensor in accordance with another embodiment of the present invention.
Figure 10:
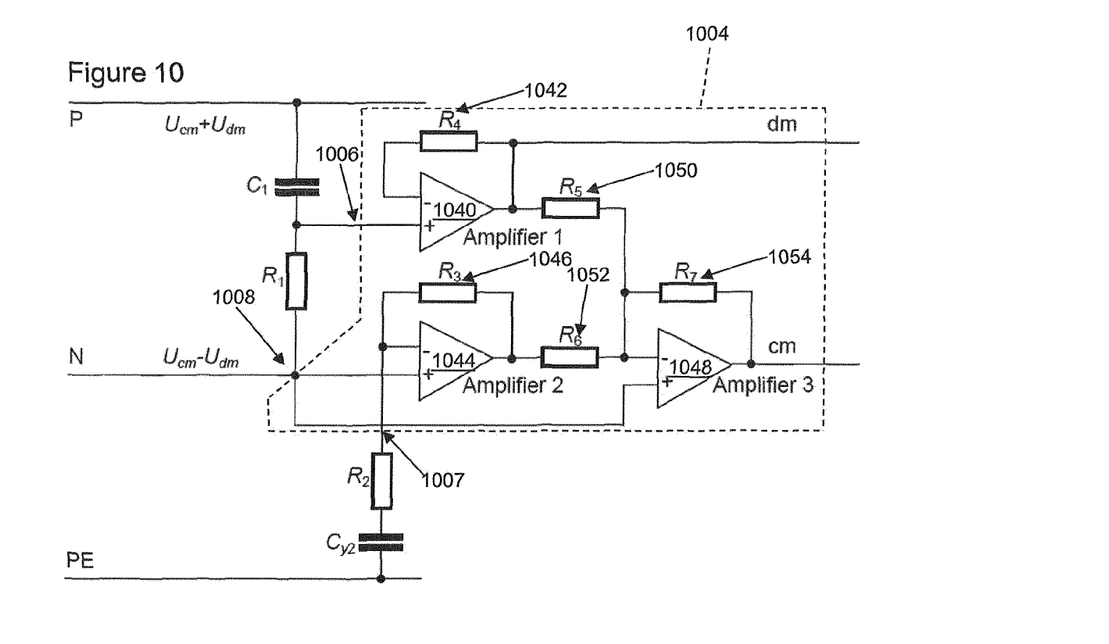
FIG. 10 illustrates a circuit diagram suitable for implementing the embodiment of the invention shown in FIG. 9 for use with an alternating current power supply.
Figure 11:
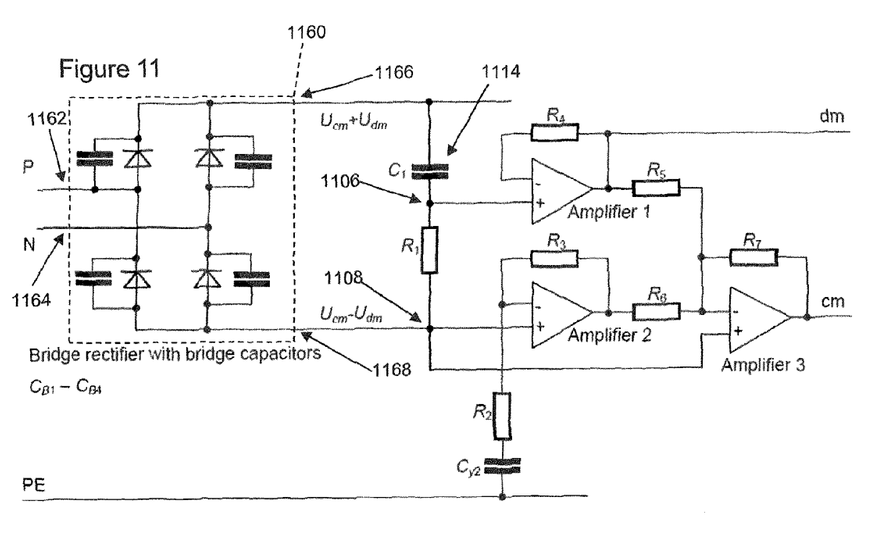
FIG. 11 illustrates a circuit diagram suitable for implementing the embodiment of the invention shown in FIG. 9 for use with a direct current power supply.

FIGS. 9 to 11 illustrate further embodiments of the invention. In these embodiments, active devices within the noise separator can be coupled to the phase, neutral (for AC) or positive or negative (for DC) terminals of the power supply. In fact, the power supply for the active devices can be coupled to any line other than protective earth.

FIG. 9 illustrates a CM-DM sensor 900 comprising a noise sensing unit 902 and a noise separator 904. The table provided below summarises the relationship between the enumerated power terminal terminology of the claims and that used to describe FIGS. 6 and 9.

| Power terminal | FIG. 6 | FIG. 9 |
| --- | --- | --- |
| First | Phase 618 | Phase 920 |
| Second | Neutral 620 | Neutral 919 |
| Third | Protective Earth 619 | Protective Earth 918 |

The noise separator 904 of FIG. 9 has a first input 906, a second input 907 and a third input 908 as well as a first output 910 for providing signalling representative of common mode noise and a second output 912 for providing signalling representative of differential mode noise. The output signals provided by the first and second outputs 910, 912 are substantially the same as those provided by the corresponding outputs of the noise sensor shown in FIG. 6. However, the outputs 910, 912 are electrically referenced to the same line to which the power supply of the active devices are referenced (here N, exemplarily DC or circuit GND). That is, the output signals are measured with respect to the same power supply line that is provided to the active devices.

Similarly, the noise sensing unit 902 comprises a first resistor 924, second resistor 922, first capacitor 914 and second capacitor 916 like the noise sensing unit illustrated in FIG. 6. However, the arrangement of these components and their connection to the noise sensing unit differs greatly from that described above in relation to the noise sensor of FIG. 6.

In FIG. 9, a first plate of the first capacitor 914 is coupled to a first power terminal 920, which may also be referred to as a phase power terminal 920, of a power supply. A second plate of the first capacitor 914 is coupled to a first terminal of the first resistor 924 and to the first input 906 of the noise separator 904. A second terminal of the first resistor 924 is coupled to both a second power terminal 919, which may also be referred to as a neutral power terminal 919 and the third input 908 of the noise separator 904. The first capacitor 914 therefore couples the phase and neutral power rails and can be an ordinary capacitor, or x-capacitor, rather than a y-capacitor.

Phase and neutral potentials labelled in FIG. 9 are referenced to protective earth and so the phase line (coupled to the phase power terminal 920) has a potential of $U_{CM}+U_{DM}$ and the neutral line (coupled to the neutral power terminal 919) a potential of $U_{CM}-U_{DM}$. The potential difference across the first resistor 924 is the difference of these two potentials resulting in 2 $U_{DM}$.

A first terminal of the second resistor 922 is coupled to a third power terminal 918, which may also be referred to as a protective earth terminal 918, of the power supply. A second terminal of the second resistor 922 is coupled to a first plate of the second capacitor 916. A second plate of the second capacitor 916 is coupled to the second input 907 of the noise separator 904. It will be appreciated that the arrangement of the second capacitor 916 and the second resistor 922 could be reversed. For safety reasons, the second capacitor 916 should be a y-capacitor.

In this embodiment only one signal is sensed with respect to protective earth. This sensing is done via a y-capacitor as the amplifiers are fed with respect to the minus of the DC-bus, the neutral N or any other power line with the exception of potential earth. In addition, the second capacitor suppresses any DC or low frequency for example, of the order of 50 to 100 Hz components from being fed back to the protective earth 918.

The safety requirements for the first capacitor 914 can be less rigorous than those for the first capacitor 614 used in embodiments shown in FIG. 6, as the first capacitor of the embodiment of FIG. 9 does not couple a line power line to the earth. This difference in component specification allow for a cost saving when manufacturing embodiments in accordance with this embodiment compared with those of the noise sensor shown in FIG. 6.

FIG. 10 shows one possible internal structure of the noise separator of FIG. 9 together with the components of the noise sensing unit 902 described with reference to FIG. 9. The arrangement shown is based on the use of three operational amplifiers 1040, 1044, 1048. The arrangement shown in FIG. 10 makes use of voltage sensing, although the skilled person will appreciate that a current sensing arrangement may also be provided. The noise separator in FIG. 9 is referenced to the mains neutral N line rather than to the protective earth line. Alternatively, the amplifiers could be referenced to the mains phase power line P, a DC bus or to a circuit GND. The power supply for amplifiers 1040, 1044, 1048 according to this embodiment can be generated with reference to the neutral line (or alternatively the phase line, dc bus or circuit GND) of the mains supply, or the switch mode power supply.

The first amplifier 1040 has a non-inverting input coupled to the first input 1006 of the noise separator 1004. The high frequency signal feeding the non-inverting input of the first amplifier 1040 represents the difference between the potentials at the phase and neutral lines. In this example, a first feedback resistor $R_4$ 1042 is connected between the output of the first amplifier 1040 and an inverting input of the first amplifier 1040 in order to provide a feedback path. The first feedback resistor $R_4$ 1042 may not be necessary in some embodiments and may be left open or be replaced by a short circuit, depending on the embodiment of the first amplifier 1040. The output of the first amplifier 1040 is proportional to the DM noise on the power supply lines measured with respect to the reference line, which is neutral 1008 in this example.

A second amplifier 1044 has a non-inverting input coupled to the third input 1008 of the noise separator 1004. An inverting input of the second amplifier 1044 is coupled to the second input 1007 of the noise separator 1004. A second feedback resistor $R_3$ 1046 is connected between the output of the second amplifier 1044 and an inverting input of the second amplifier in order to provide a feedback path. The signal at the output of the second amplifier 1044 is proportional to CM noise minus DM noise ($U_{CM}-U_{DM}$).

A third amplifier 1048 is configured to receive signals from the outputs of the first and second amplifiers 1040, 1044 at its inverting input via first channel resistor $R_5$ 1050 and second channel resistor $R_6$ 1052, respectively. The third amplifier 1048 effectively sums the signals from the first and second amplifiers 1040, 1044. The non-inverting input of the third amplifier is coupled to the third input 1008 of the noise separator 1004. A third feedback resistor $R_7$ 1054 is connected between the output of the third amplifier 1048 and its inverting input in order to provide a feedback path. The output of the third amplifier is proportional to the common mode noise.

The circuit in FIG. 11 illustrates an embodiment of the invention configured to act on a direct current (rectified) power supply. Operation of a bridge rectifier 1160, which is shown with bridge capacitors, takes its conventional form. The bridge rectifier 1160 has phase and neutral terminals 1162, 1164 which take a single phase AC signal and provide DC power at first and second outputs 1166, 1168 of the bridge rectifier 1160. The first output 1166 of the bridge rectifier 1160 is coupled to the first input 1106 of the noise separator via the first capacitor 1114. The second output 1168 of the bridge rectifier 1160 is coupled to the third input 1108 of the noise separator. The power supplies of amplifiers within the noise separator, and so the CM and DM outputs of the noise separator, are referenced to the second output of the bridge rectifier 1168.

The embodiments of the invention described in FIGS. 6 and 9 can solve the common technical problem of separating common and differential mode noise without using an inductor. However, there are two major differences between these two embodiments. Firstly, the method used to perform the noise separation is different, which results in divergence in the implementation of the two embodiments. Secondly, due to the different arrangement of the sensing elements, the second embodiment of the invention can reference the noise sensing circuit to the minus of the DC bus (or neutral, in the case of an AC supply, or any other lines), rather than to protective earth as required by embodiments in accordance with the first aspect of the invention.

The ability to supply the active CM-DM separator with respect to the DC bus is another feature that distinguishes the embodiment of FIG. 9 of the invention over the prior art.

Embodiments of the present invention provide a method of separating CM and DM noise by means of semiconductor technology that may be implemented without magnetic sensing elements. This may be advantageous as magnetic, or inductive, components can require a greater physical space than the sensing components of the present invention. Furthermore, using inductive components as sensing elements can lead to a decrease in bandwidth achieved by prior art sensors, as well as resulting in low amplitude detected signals.

There may be provided an EMI sensor. The EMI noise sensor may use only capacitors and resistors as external components and as a sensing unit. The sensor may separate the sensed noise in a CM-DM noise separator into its CM and DM components. The CM-DM noise separator may be implemented in an IC. The sensor may provide two output signals, one that is proportional to the CM noise and another one that is proportional to the DM noise.

The noise sensor may use a current input or a voltage input for the IC. The noise sensor may use external capacitors as sensing units or measuring units that convert the noise into a current or voltage. The outputs of the sensor may be realised as current outputs or as voltage outputs.

The sensor may use series connections of capacitors and resistors as sensing units or measuring units whereby the voltages across the resistors are detected.

One or more components illustrated as being discrete components (such as capacitors and resistors) may alternatively be integrated into an integrated circuit (IC). A single IC may provide the components of both the noise separator and the noise sensor.

The sensor may amplify the obtained CM and DM signals. The two output signals may be provided at two different ports. The sensor may ensure an internal availability of the two output signals for post-processing purposes. The sensor may determine the CM signal by an addition and/or may determine the DM signal by a subtraction.

It will be appreciated that the functionality and methods presented herein can also be applied to any multi wire system such as three phase systems.

There may be provided an active EMI filter comprising any sensor disclosed herein.

The invention claimed is:

1. A noise sensor having a first power terminal and a second power terminal and a third power terminal for receiving signals from a power supply, the noise sensor comprising:
 a noise separator having a first input, a second input, a third input, a first output for providing a first output signal representative of common mode noise and a second output for providing a second output signal representative of differential mode noise; and
 a noise sensing unit, wherein the noise sensing unit comprises:
  a first capacitive element that couples the first input of the noise separator to the first power terminal; and
 the noise sensing unit further comprises either:
  a second capacitive element that couples the second input of the noise separator to the second power terminal;
  a first resistive element that couples the first input of the noise separator to the third power terminal; and
  a second resistive element that couples the second input of the noise sensor to the third power terminal,
 or the noise sensing unit further comprises:
  a second capacitive element that couples the second input of the noise separator to the third power terminal;
  a coupling between the second power terminal and the third input of the noise separator;
  a first resistive element that couples the first input of the noise separator to the second power terminal; and
  a second resistive element that couples the second input of the noise separator to the third power terminal via the second capacitive element;
 wherein the noise separator includes circuitry that is configured to:
  generate the first output signal representative of common mode noise by adding a signal from the first input to a signal from the second input, and
  generate the second output signal representative of the differential mode noise by taking a difference of the first and second input signals.

2. The noise sensor of claim 1, further comprising a coupling between the third power terminal and the third input of the noise separator and wherein the second resistive element couples the second input of the noise separator to the third input of the noise separator.

3. The noise sensor of claim 2, wherein the first capacitive element comprises a y-capacitor and the second capacitive element comprises a y-capacitor.

4. The noise sensor of claim 3, wherein the resistance of the first resistive element is substantially equal to the resistance of the second resistive element.

5. The noise sensor of claim 1, wherein the noise separator comprises:
 an adder, wherein inputs of the adder are coupled to the first input and the second input of the noise separator, and an output of the adder is coupled to the first output of the noise separator; and
 a subtractor, wherein inputs of the subtractor are coupled to the first input and the second input of the noise separator, and an output of the subtractor is coupled to the second output of the noise separator.

6. The noise sensor of claim 5, wherein the noise separator further comprises:
 an output amplifier between the output of the adder and the first output of the noise separator; and
 an output amplifier between the output of the subtractor and the second output of the noise separator.

7. The noise sensor of claim 5, wherein the noise separator further comprises:
 a first input amplifier, wherein an input of the first input amplifier is coupled to the first input of the noise separator, and an output of the first input amplifier is coupled to a first input of the adder (and a first input of the subtractor; and
 a second input amplifier, wherein an input of the second input amplifier is coupled to the second input of the noise separator, and an output of the second input amplifier is coupled to a second input of the adder and a second input of the subtractor.

8. The noise sensor of claim 1, wherein the first capacitor is not a y-capacitor.

9. The noise sensor of either claim 1, wherein the noise separator is configured to provide a signal at its first output derived from a signal provided to its first input with reference to the second terminal of the power supply.

10. The noise sensor of claim 1, wherein the noise separator is configured to provide a signal at its second output derived from a summation of a signal derived from its first and third input taken with reference to a signal received at its second input.

11. The noise separator of claim 1, wherein the noise separator is implemented using amplifiers and power is fed to the amplifiers with respect to the second power terminal.

12. The noise sensor of claim 1, wherein the first input and the second input of the noise separator are configured to receive voltage input signals.

13. The noise sensor of claims 1, wherein the first input and the second input of the noise separator are configured to receive current input signals.

14. The noise sensor of claim 1, wherein the first output and the second output of the noise separator are configured to provide current output signals.

15. The noise sensor of claim 1, wherein the first output and the second output of the noise separator are configured to provide voltage output signals.

16. The noise sensor of claim 1, wherein the output of the sensor is provided to a device configured to at least partially compensate for common mode noise and/or differential mode noise in the power supply.

17. The noise sensor of claim 1, wherein the cumulative reactance between the first input of the noise separator and the first power terminal is capacitive reactance; and
 the cumulative reactance between the second input of the noise separator and the second power terminal or the third power terminal is capacitive reactance.

18. A noise sensor of claim 1, wherein the noise sensing unit comprises only capacitors and resistors.

19. A noise sensor of claim 1, wherein the noise separator is realized as an integrated circuit.

20. A noise sensor of claim 1, wherein the noise sensing unit is realized with discrete components.

21. A noise sensor of claim 1, wherein the noise sensing unit is provided in the same integrated circuit as the noise separator.

22. A noise sensor of claim 1, that provides only either CM or DM output signals.

23. The noise sensor of claim 1, wherein the sensor does not include an inductor.

* * * * *